(12) United States Patent
Ando et al.

(10) Patent No.: US 7,291,868 B2
(45) Date of Patent: Nov. 6, 2007

(54) LIGHT-EMITTING SEMICONDUCTOR DEVICE AND A METHOD OF MANUFACTURING IT

(75) Inventors: Masanobu Ando, Aichi-ken (JP); Masahito Nakai, Aichi-ken (JP); Toshiya Uemura, Aichi-ken (JP); Masaaki Nakayama, Nara-ken (JP)

(73) Assignee: Toyoda Gosei Co., Ltd., Nishikasugai-Gun, Aichi-Ken (JP)

( * ) Notice: Subject to any disclaimer, the term of this patent is extended or adjusted under 35 U.S.C. 154(b) by 0 days.

(21) Appl. No.: 10/564,416

(22) PCT Filed: Aug. 20, 2004

(86) PCT No.: PCT/JP2004/012340

§ 371 (c)(1),
(2), (4) Date: Jan. 12, 2006

(87) PCT Pub. No.: WO2005/020395

PCT Pub. Date: Mar. 3, 2005

(65) Prior Publication Data

US 2006/0163585 A1    Jul. 27, 2006

(30) Foreign Application Priority Data

Aug. 21, 2003  (JP) ............................. 2003-297682

(51) Int. Cl.
*H01L 29/24* (2006.01)

(52) U.S. Cl. .................. 257/103; 257/101; 257/102
(58) Field of Classification Search ............ 257/103, 257/102, 101; 438/37

See application file for complete search history.

(56) References Cited

U.S. PATENT DOCUMENTS

| | | | |
|---|---|---|---|
| 5,578,839 A | 11/1996 | Nakamura et al. | |
| 6,100,586 A | 8/2000 | Chen et al. | |
| 6,995,389 B2 * | 2/2006 | Kim et al. | 257/13 |
| 2002/0171092 A1 | 11/2002 | Goetz et al. | |

FOREIGN PATENT DOCUMENTS

EP    0 662 739 A1    7/1995

(Continued)

OTHER PUBLICATIONS

European Search Report dated Mar. 8, 2006.

(Continued)

*Primary Examiner*—Sara Crane
(74) *Attorney, Agent, or Firm*—McGinn IP Law Group, PLLC

(57) ABSTRACT

In layer structure 20 of a semiconductor laser of a surface emitting type, 21 and 24 represent an n-type contact layer made of n-type GaN and a p-layer made of p-type AlGaN, respectively. In the laser, an n-type DBR layer 22 made of n-type InGaN and a DBR layer 25 made of dielectric are formed on and below a InGaN active layer 23, respectively, each of which forms a reflection surface vertical to the z axis. By forming a reflection surface vertical to the z axis at each of on and above the active layer 23, a resonator is obtained. Here optical distance between two reflection facets are arranged to an integral multiple of half a oscillation wavelength. Consequently, the present invention enables to produce a semiconductor laser of a surface emitting type easier by far compared with a conventional invention.

22 Claims, 6 Drawing Sheets

FOREIGN PATENT DOCUMENTS

| | | |
|---|---|---|
| EP | 1 280 212 A2 | 1/2003 |
| JP | 11-16812 | 1/1999 |
| JP | 11-026812 | 1/1999 |
| JP | 11-46038 | 2/1999 |
| JP | 2001-160627 | 6/2001 |
| JP | 2002-16284 | 1/2002 |
| JP | 2002-43695 | 2/2002 |
| JP | 2003-101081 | 4/2003 |
| JP | 2003-197969 | 7/2003 |
| JP | 2003-229645 | 8/2003 |
| JP | 2003-234545 | 8/2003 |

OTHER PUBLICATIONS

Kneissl, et al. "Continuous-wave operation of ultraviolet InGaN/InAlGaN multiple-quantum-well laser diodes", Applied Physics Letters, AIP, American Institute of Physics, Melville, NY, US, vol. 82, No. 15, Apr. 14, 2003, pp. 2386-2388, XP012033738.

Nakamura, et al. "InGaN/GaN/AlGaN-based laser diodes with modulation-doped strained-layer superlattices grown on an epitaxially laterally overgrown GaN substrate", Applied Physics Letter, AIP, American Institute of Physics, Melville, NY, US, vol. 72, No. 2, Jan. 12, 1998.

R.P. Schneider, Jr. et al., "MOVPE growth of InAlGaP-based visible vertical-cavity surface-emitting lasers" Journal of Crystal Growth 124 (1992) 763-771 North-Holland.

S. Keller et al., "Growth of bulk InGaN films and quantum wells by atmospheric pressure metalorganic chemical vapour deposition" Journal of Crystal Growth 170 (1997) 349-352.

C.F. Klingshirn, "Semiconductor Optics" Springer, p. 284-331.

* cited by examiner

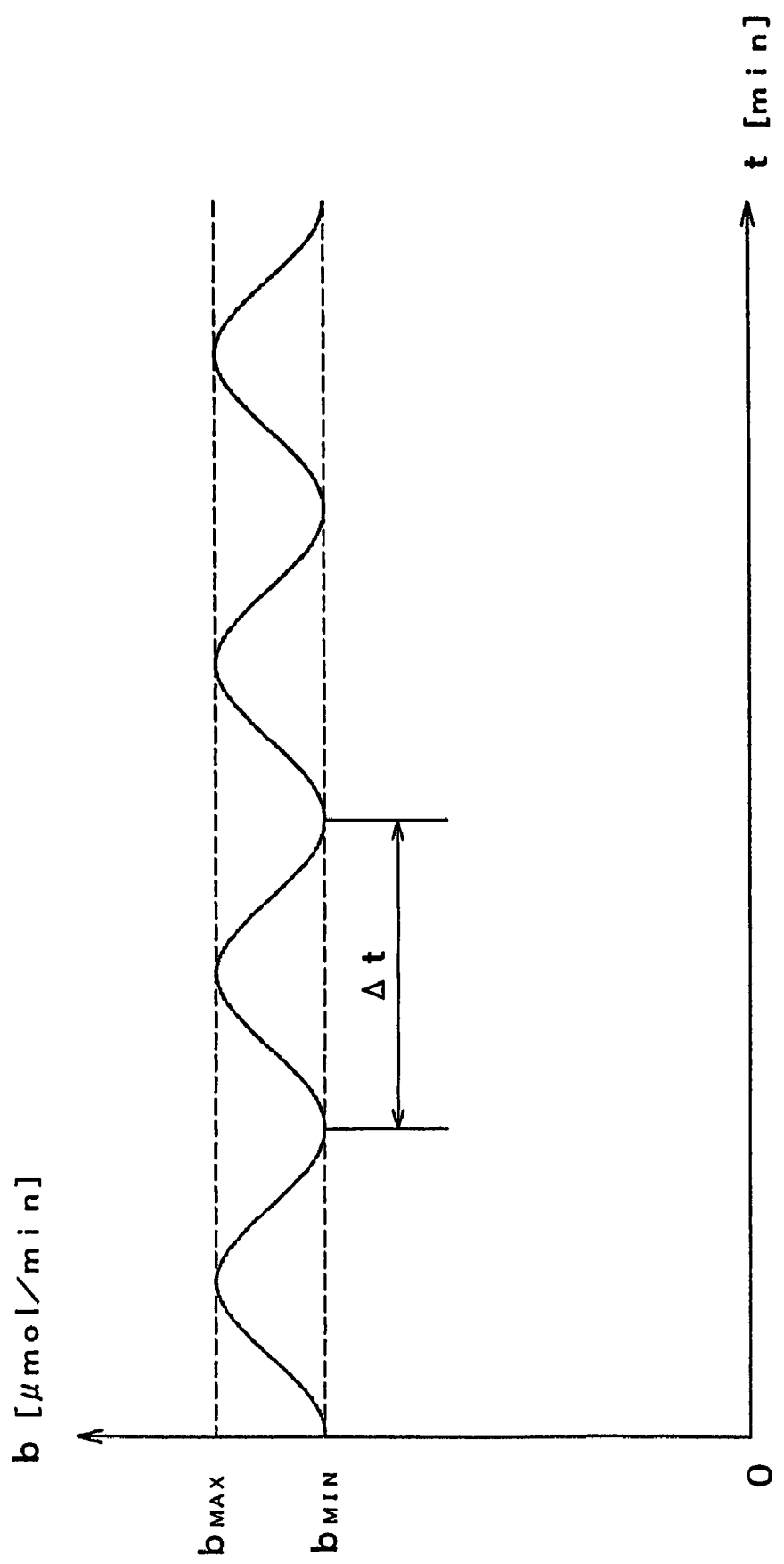

LIGHT-EMITTING SEMICONDUCTOR DEVICE AND A METHOD OF MANUFACTURING IT

FIELD OF THE INVENTION

The present invention relates to a light-emitting semiconductor device which comprises an active layer of single-layer structure.

The present invention can be applied not only to a light-emitting semiconductor device such as a light-emitting diode (LED) but also to a light-receiving semiconductor device.

DISCLOSURE OF THE PRESENT INVENTION

As a surface emitting type of semiconductor laser, for example, a device disclosed in the following patent document 1 has been well-known. Such a surface emitting type of semiconductor laser comprises an active layer of MQW structure in order to enlarge its gain.

Also, some of a light-emitting diode (LED) and a semiconductor laser of a surface emitting type may comprise an active layer of MQW structure. FIG. 6 is a perspective view illustrating a surface emitting type of semiconductor laser shown in a patent document 2 listed below. Such an active layer of MQW structure is employed to a lot of light-emitting semiconductor device now.

[Patent document 1] Japanese Laid-open patent application H11-46038

[Patent document 2] Japanese Laid-open patent application 2001-160627

[Non-patent document 1] C. F. Klingshirn, "Semiconductor Optics," Chapter 19

DISCLOSURE OF THE PRESENT INVENTION

However, problems persist in an active layer of MQW structure as follows.

(1) Owing to its complex structure, it is difficult to design the active layer.

Especially when the device is a surface emitting type of semiconductor laser, the optical distance between two reflection planes which are formed by, for example, DBR (Distributed Bragg Reflector), is designed considering refractive index of each component so that it becomes an integral multiple of half a oscillation wavelength $\lambda$. Accordingly, the more complex the structure of an active layer is, the more complicated its design becomes.

(2) Owing to its complicated structure, a method for manufacturing the device also becomes complicated.

Especially, at the interface of a well layer and a barrier layer, it is desired that gap (gradient) of energy levels is as sharp as possible. In order to obtain such structure, material gas needs to be exhausted once before forming the next layer through crystal growth when a growth layer of semiconductor crystal is changed to a layer which is to be formed next. Also, the temperature of the crystal growth needs to be controlled for each layer according to the respective suitable crystal growth temperatures of the well layer and the barrier layer and a process for forming a cap layer should be further employed in order to prevent the well layer from vaporizing while increasing the temperature.

Accordingly, a conventional invention unprofitably consumes materials and requires longer time for crystal growth. That is, MQW structure is not always a desirable structure for active layer considering materials, cost and productivity. Especially, the more well layers are deposited, the more this problem comes to the front and becomes strongly apparent. Consequently, it is difficult to produce an active layer of high gain easily and at lower cost in a conventional invention.

The present invention has been accomplished in order to overcome the aforementioned drawbacks. Thus, an object of the present invention is to produce an active layer of high gain easily at lower cost, to thereby reduce the cost for manufacturing a light-emitting semiconductor device

MEANS TO SOLVE THE PROBLEMS

The following means may be useful to overcome the above-described drawbacks.

That is, the first aspect of the present invention provides a light-emitting semiconductor device which is formed by depositing plural layers of group III nitride compound semiconductor, comprising an active layer having single layer structure of a semiconductor layer at least including indium (In), wherein composition ratio a of indium (In) is in a range of 0.0001 to 0.05, the composition ratio a is varied at a constant period L in waveform in a direction of the z axis which is parallel to the growth axis of the active layer, and the period L is arranged to be an approximately constant value selected from a range of 1 nm to 10 nm.

Here a group III nitride compound semiconductor generally includes a binary, ternary, or quaternary semiconductor represented by a formula $Al_{1-x-y}Ga_yIn_xN$ ($0 \leq x \leq 1$, $0 \leq y \leq 1$, $0 \leq 1-x-y \leq 1$) and having an arbitrary composition ratio. And a group III nitride compound semiconductor in the present specification further includes a semiconductor doped with p-type or n-type impurity.

Alternatively, a semiconductor whose portion of the group III elements (Al, Ga, In) may be replaced with boron (B) or thallium (Tl), and a portion of nitrogen (N) may be replaced with phosphorous (P), arsenic (As), antimony (Sb), orbismuth (Bi) is also included ina group III nitride compound semiconductor of the present specification.

Examples of the p-type dopant which can be added include magnesium (Mg) and calcium (Ca).

Examples of the n-type dopant which can be added include silicon (Si), sulfur (S), selenium (Se), tellurium (Te), and germanium (Ge).

These dopants may be used in combination of two or more species, and a p-type dopant and an n-type dopant may be added simultaneously.

As a crystal growth method for crystal growing a semiconductor crystal on a substrate, MOVPE, HVPE, and MBE processes can be applied.

The second aspect of the present invention is a light-emitting semiconductor device which is formed by depositing plural layers of group III nitride compound semiconductor, comprising an active layer having single layer structure of a semiconductor layer at least including indium (In), wherein composition ratio a of indium (In) is in a range of 0.0001 to 0.05, the composition ratio a is varied at a constant period L in waveform in a direction of the z axis which is parallel to the growth axis of the active layer, and the period L is arranged to be an approximately constant value selected from a range of one to six times of Bohr radius R.

Here compositions, impurities and method for crystal growth of the group III nitride compound semiconductor can be the same as that of the first aspect.

The more preferable range for the period L is one to four times of Bohr radius R. Here Bohr radius R is determined by the following equation (1):

(Bohr Radius)

$$R = 2\pi^2 e^4/h^2 \in^2 M,$$

$$1/M \equiv 1/m_e^* + 1/m_h^* \quad (1)$$

(Sign)

$m_e^*$ : effective mass of electron
$m_h^*$ : effective mass of hole
e: elementary electric change
h: plunk constant
$\in$: average dielectric constant in the active layer
$\pi$: circle ratio Although dielectric constant $\in$ and each of other effective mass ($m_e^*$ and $m_h^*$) may have directional dependence, then the value in the z axis direction (: growth axis direction) may be adapted.

For example, with respect to gallium nitride (GaN), dielectric constant $\in$, effective mass of electron $m_e^*$ and effective mass of hole $m_h^*$ are as in equation (2):

$$\in = 5.4$$

$$m_e^* = 0.20 m_0,$$

$$m_h^* = 1.4 m_0 (m_0: \text{rest mass of electron}) \quad (2)$$

The third aspect of the present invention according to the first or second aspect is that the period L is an approximately constant value selected from a range of 2.4 nm to 6.8 nm.

More preferably, the period L is in a range from about 2.9 nm to 6.0 nm.

The fourth aspect of the present invention according to any one of the first to third aspects is that the composition ratio a is in a range from 0.010 to 0.040.

More preferably, the composition ratio a is in a range from about 0.02 to 0.03.

The fifth aspect of the present invention according to any one of the first to fourth aspects is that gradient $\partial a/\partial z$ is arranged to be 0.01 $nm^{-1}$ or less at almost all places.

The sixth aspect of the present invention provides a surface emitting type of semiconductor laser which is manufactured according to any one method of the first to fifth aspects, comprising reflection planes vertical to the z axis, each of which is formed on and below the active layer, respectively, wherein optical distance $\Delta Z$ between two reflection planes are arranged to an integral multiple of half a oscillation wavelength $\lambda/2$.

Here "oscillation wavelength $\lambda$" is a wavelength of lights in vacuum emitted by laser oscillation. And "optical distance $\Delta Z$" is a length in the z axis direction in optical oscillation region defined by equation (3). The right side of the equation (3) is definite integral and the range of the integral is obviously defined by position coordinate of each reflection plane. Function n (z, $\lambda$) is reflection index of a semiconductor crystal at each coordinate z and the function n obviously depends not only on coordinate z but also oscillation wavelength $\lambda$.

$$\Delta Z \equiv \int n(z, \lambda) dz \quad (3)$$

The seventh aspect of the present invention according to the sixth aspect is that the integer number is in a range of from 1 to 10.

The eighth aspect of the present invention provides a method for manufacturing a surface emitting type of semiconductor laser according to any one method of the first to seventh aspects, wherein supply amount of indium (In) material gas per unit time to the crystal growth surface on which the active layer grows is varied at a constant period selected from a range of 10 sec. to 6 min.

The ninth aspect of the present invention according to the eighth aspect is that the period is an approximately constant selected from a range of 30 sec. to 2 min.

The tenth aspect of the present invention is a light-emitting semiconductor device according to any one of the first to seventh aspects in which the active layer is doped with a donor impurity so that its electron concentration may be in a range from $1 \times 10^{16}/cm^3$ to $1 \times 10^{18}/cm^3$ at a room temperature.

Silicon is preferable as a donor impurity. And more preferable range of the active layer in a room temperature is from $5.0 \times 10^{16}/cm^3$ to $5.0 \times 10^{17}/cm^3$.

Through employment of the aforementioned aspects of the present invention, the aforementioned drawbacks can be overcome effectively and rationally.

EFFECTS OF THE INVENTION

Effects to be obtained by the present invention are as follows.

At this stage, we consider that the first aspect of the present invention is approximately the same aspect as the second aspect. According to the first and the second aspects, an active layer having high gain can be manufactured by far easier compared with a conventional art. The gain is large enough to occur stimulated emission and laser oscillation stably and continuously according to the structure of a light-emitting semiconductor device comprising the active layer.

Arranging the period L to be an approximately constant value in a range of 1 nm to 10 nm enables to provide high gain because the period L corresponds to Bohr radius R of an electron-hole pair existing in the active layer.

This stimulated emission is, as shown in FIGS. 3A and 3B, generated at the longer wavelength side (lower energy side) of spontaneously emitted lights. For example, as shown in FIGS. 3A and 3B, the peak of emission output shifts about 6 nm to the longer wavelength side as the amount of injection carrier I increases over about $0.1 I_0$ to $0.2 I_0$ to a standard value $I_0$. Such emission mechanism may be structured by the following processes.

(Emission Mechanism)

Electron-hole pairs (excitons EX) generated in the active layer collide to other excitons (EX), and then one exciton is scattered to an exciton state (EX*) at higher energy side which has two or more quantum number while the other exciton is scattered to optical branch level at the lower energy side and is converted into lights (EX+EX→EX*+ photon). Such phenomenon is called P radiation process owing to exciton-exciton scattering, and, as disclosed in the non-patent document 1 listed above, it is observed by means of optical pumping in a semiconductor, which is not a group III nitride compound semiconductor.

In addition to exciton-exciton scattering, electron-exciton scattering also contributes to the process of stimulated emission effectively. That is, the stimulated emission mechanism depend on the electron concentration in the active layer. The inventors of the present invention confirmed that the stimulated emission process due to electron-exciton scattering is also generated overlapping with the stimulated emission due to exciton-exciton scattering process when the active layer has the electron concentration about $5.0 \times 10^{16}$ $cm^{-3}$ or more.

Accordingly, the active layer is preferably doped with n-type impurity to have the electron concentration of $5.0 \times 10^{16}$ cm$^{-3}$ or more at a room temperature. As a result, the threshold can be decreased by about 10%. When the impurity concentration in the active layer is too high, impurity scattering occurs and that is not desirable. It is preferable to dope donor impurity such as silicon to the active layer so that electron concentration may be in a range from $1 \times 10^{16}$/cm$^3$ to $1 \times 10^{18}$/cm$^3$. More preferably, the electron concentration of the active layer at a room temperature is in a range from $5.0 \times 10^{16}$/cm$^3$ to $1 \times 10^{18}$/cm$^3$, and further preferably from $5.0 \times 10^{16}$/cm$^3$ to $5.0 \times 10^{17}$/cm$^3$. When the active layer has those ranges of electron concentration, its oscillation threshold can be decreased by about 10% compared with that of a laser having a non-doped active layer whose electron concentration is smaller than $1 \times 10^{16}$/cm$^3$ or $1 \times 10^{15}$/cm$^3$.

The inventors of the present invention consider that such a stimulated emission mechanism can be realized by means of injection of electric current into the group III nitride compound semiconductor effectively according to the first and second aspects of the present invention. It can be obviously understood from the non-patent document 1 that the gain necessary for the stimulate emission can be obtained when at least two excitons, in theory, go through the above explained processes.

In other words, by properly localizing excitons in an active layer, scattering occurs more frequently compared with the case when excitons are completely free to move. Also, the first and second aspects of the present invention can bring a remarkably ideal condition for localizing excitons.

Consequently, according to the first or the second aspect of the present invention, high gain can be obtained using an active layer of simple structure. For example, with respect to a semiconductor laser, only by forming its active layer to comprise proper rate of In, a semiconductor laser whose threshold voltage is remarkably low can be manufactured.

According to the third aspect of the present invention, the period L can correspond to the exciton radius R when the active layer is made of a non-doped InGaN or AlInGaN. Accordingly, actions and effects described above can be securely obtained.

According to the fourth aspect of the present invention, the active layer having high luminous efficiency can be formed to have a larger thickness, which is very useful. When the composition ratio a of indium (In) in the active layer is too large, stress generated in the device becomes too large by forming the active layer to have enough thickness. That is not desirable in quality of a device. When the composition ratio of indium (In) in the active layer is too small, it is obvious that luminous efficiency decreases.

For example, when the active layer is formed to have thickness of 500 nm or more, limitation of the composition ratio of indium (In) is around 2%. When the composition ratio a of In is larger than 2%, defects such as cracks are generated in a device and life of a device tends to be shorter.

According to the fifth aspect of the present invention, the full width at half-maximum of spectrum of light emitted from the active layer can be smaller to some extent.

According to the sixth aspect of the present invention, structure in resonant direction can be quite simple. That makes it easier to design and manufacture a surface emitting type of semiconductor laser compared with a conventional art.

Optical distance $\Delta Z$ between the mirror surfaces is preferably one to ten multiple of half an oscillation wavelength $\lambda$ ($\lambda/2$) (the seventh aspect of the present invention). When the optical distance is less than one multiple of half an oscillation wavelength, laser cavity structure in the z axis direction cannot be formed, which is undesirable and is too obvious to mention. When the optical distance is too large, stress generated in a device becomes too much by forming the active layer to have enough thickness. That tends to cause cracks and distortions and it may become difficult to maintain sufficient quality of a device.

According to the eighth aspect of the present invention, the active layer having excellent quality can be easily manufactured only by controlling supply amount of material gas comprising indium (In).

In order to vary composition ratio of indium (In), proportion of relative supply amount of material gas comprising indium (In) to supply amount of other material gas is varied. Alternatively, supply amount of other material gas may function as a control parameter, and the active layer can be also formed to have excellent quality.

According to the ninth aspect of the present invention, the active layer is maintained to have crystal of higher quality while decreasing crystal growth time of the active layer (: obtaining high productivity).

According to the tenth aspect of the present invention, higher gain is obtained and the threshold voltage can be reduced.

BRIEF DESCRIPTION OF THE DRAWINGS

FIG. 2 is a graph showing TMI supplying method when the active layer is growing.

DETAILED DESCRIPTION OF EXAMPLARY EMBODIMENTS

The present invention will be described hereinbelow with reference to specific embodiments.

However, the present invention cannot be limited to each embodiment described below.

Embodiment 1

Figure 1:
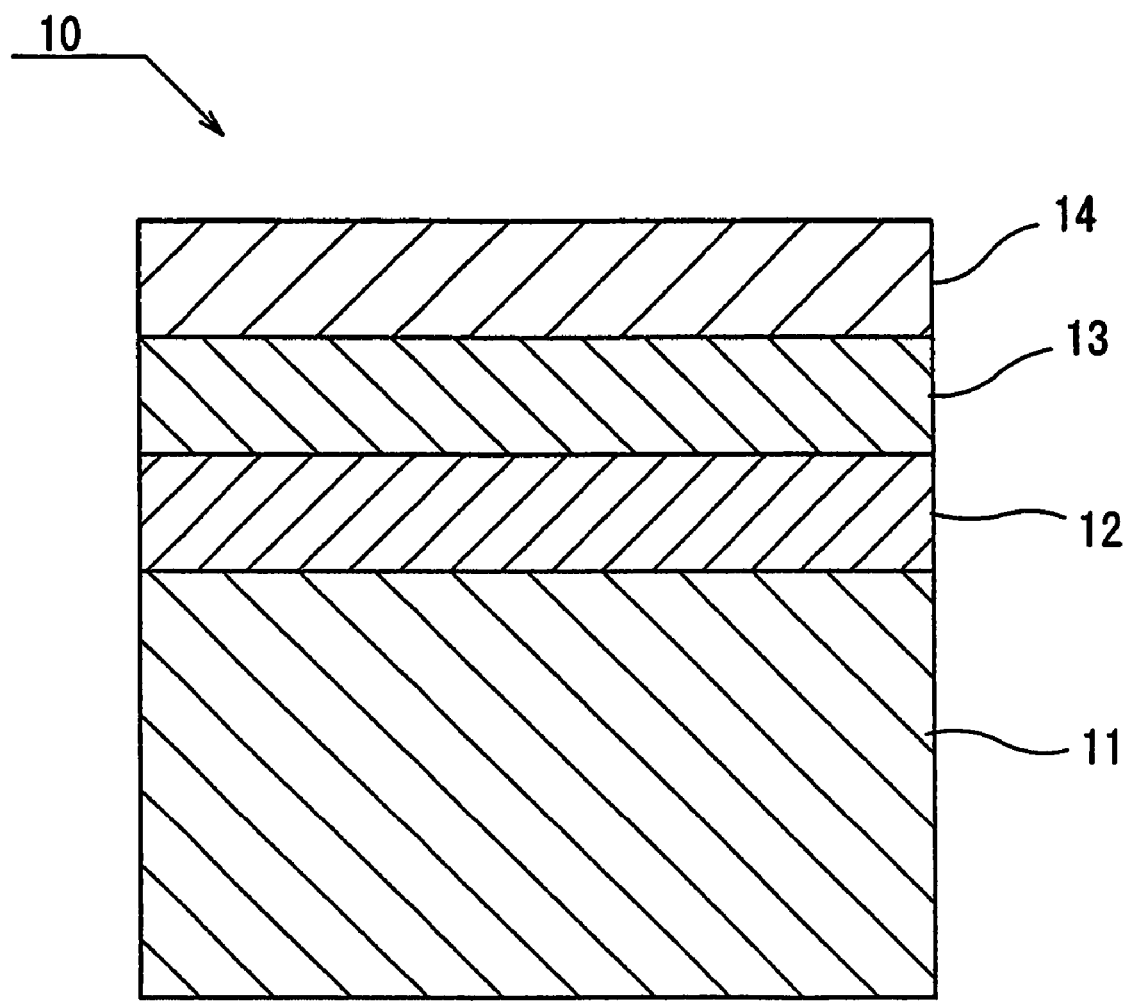
FIG. 1 is a sectional view illustrating layer structure of semiconductor crystal comprising an active layer of the present invention.

FIG. 1 is a sectional view illustrating layer structure 10 of semiconductor crystal comprising an active layer of a light-emitting semiconductor device (an edge emitting type of semiconductor laser) of the present invention.

An n-type layer 11 made of silicon (Si) doped gallium nitride (GaN) has a carrier concentration of about $10^{19}$ cm$^{-3}$. A non-doped active layer 12 formed thereon through crystal growth is made of InGaN whose indium composition ratio is 0.02 and has thickness of about 200 nm. On the active layer 12, a p-type clad layer 13 made of magnesium (Mg) doped p-type AlGaN and a p-type contact layer 14 made of magnesium (Mg) doped p-type AlGaN are deposited in sequence through crystal growth. Aluminum (Al) composition ratio of the p-type contact layer 14 is smaller than that of the p-type clad layer 13. Here, the p-type contact layer 14 may not necessarily comprise aluminum.

The active layer 12 is formed through crystal growth described below.

While the temperature is kept at 650° C., InGaN whose indium (In) composition ratio is 0.02 is kept growing at an average growth velocity of 5 nm/min. for 40 minutes on the crystal growth surface of the n-type layer 11 through MOVPE process. As a result, InGaN having indium average composition ratio 0.02 is grown to be about 200 nm in thickness.

At this time, trmethyl gallium (TMG: $Ga(CH_3)_3$), trmethil indium (TMI: $In(CH_3)_3$), and ammonia ($NH_3$) are employed as materials to form InGaN layer and $N_2$ is employed as a flow gas.

Supply amount of TMI per unit time is controlled as shown in FIG. 2. FIG. 2 is a graph showing supply amount of TMI while the active layer 12 is formed through crystal growth.

Here amplitude of varying TMI supply amount ($\equiv (b_{MAX} - b_{MIN})/2$) and time period $\Delta t$ should be focused. When the amplitude is too large, the full width at half-maximum of output spectrum becomes larger. When the amplitude is too small, excitons can hardly be bound to vallies of an energy band. So while forming the active layer 12 through crystal growth, the maximum amount $b_{MAX}$ of TMI supply amount is designed to be 8 μmol/min., and the minimum amount $b_{MIN}$ is 7 μmol/min.

The time period $\Delta t$ functions as a parameter which determines period L when indium composition ratio a in the active layer 12 is oscillated in the z axis direction parallel to the growth axis at an approximately constant period L.

As described above, the period L of the composition ratio a in the z axis direction may correspond to Bohr radius R in equation (1). Bohr radius R can be obtained by substituting the physical constant of InGaN whose indium composition ratio is 0.02.

(Physical Constant of InGaN)

$a=0.02$ (average), $\in = 8.91$ (average), $me^* = 0.19 m_0$, $mh^* = 1.4 m_0$ ($m_0$: rest mass of an electron)     (4)

By substituting equation (4) for equation (1), Bohr radius R in the active layer 12 becomes 2.82 nm. In order that this value is equal to the period L, the time period $\Delta t$ in FIG. 2 may be about 34 sec. judging from the average growth velocity (5 nm/min.). By controlling TMI supply amount b per unit time at that period, the active layer 12 whose indium composition ratio a is locally and periodically large (thick) and small (thin) can be obtained. At this time, when the active layer 12 has thickness of about 200 nm, the active layer has 71 thick and thin periods of indium composition ratio a.

Here time period $\Delta t$ may be about 40 sec. At this time, judging from the average growth velocity (5 nm/min.), the period L is about 3.3 nm. Then the active layer 12 having a thickness of 200 nm comprises 60 thick and thin periods of indium composition ratio a.

In short, the active layer 12 has a distribution of indium composition ratio a that is repeated in approximately sine wave having nearly constant period about L=3.3 nm along the z-axis direction (growth axis direction) and the average value (e.g., 0.02). Oscillation of this thick and thin is designed in proportion to that of TMI supply amount per unit time ($\equiv (b_{MAX} - b_{MIN})/2$).

As mentioned before, the carrier concentration of the n-type layer 11 made of silicon (Si) doped n-type gallium nitride (GaN) is about $10^{19} cm^{-3}$. Amount of injection carrier of that carrier concentration is called $I_0$ hereinafter.

Figure 3A:
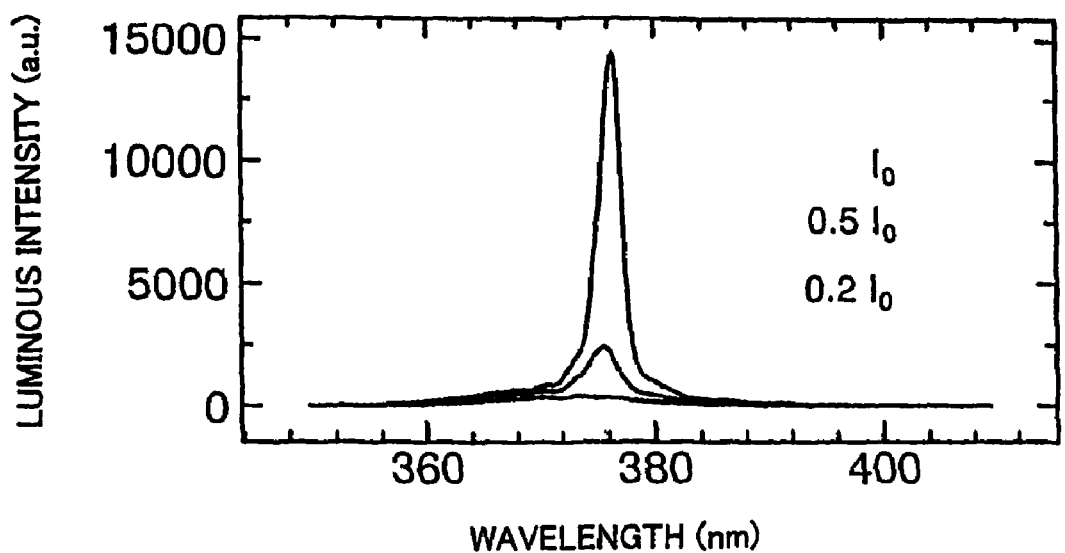
FIG. 3A is a graph illustrating output characteristic of a edge emitting type of semiconductor laser comprising the layer structure shown in FIG. 1.
Figure 3B:
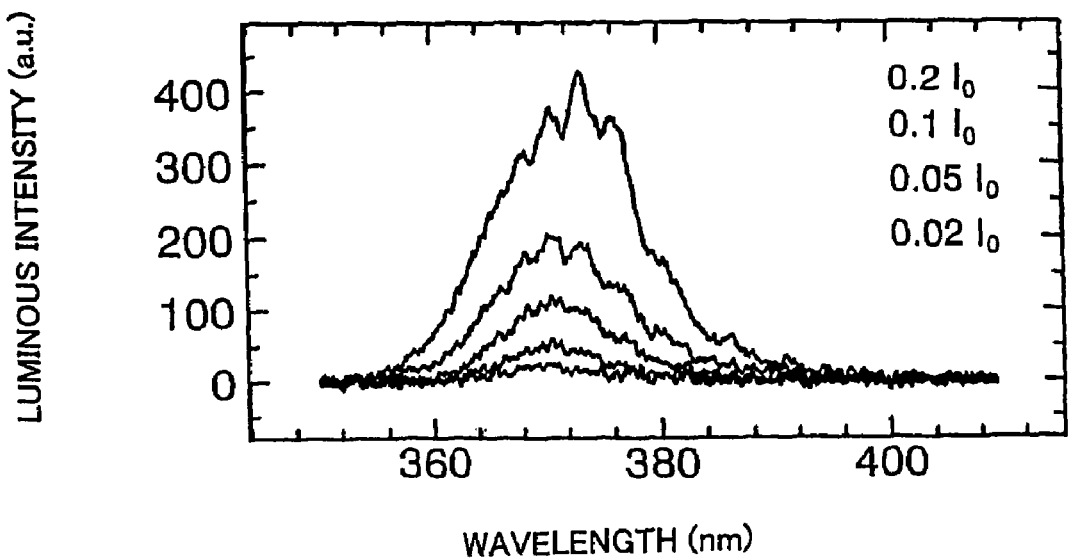
FIG. 3B is a graph illustrating output characteristic of a edge emitting type of semiconductor laser comprising the layer structure shown in FIG. 1.
Figure 6:
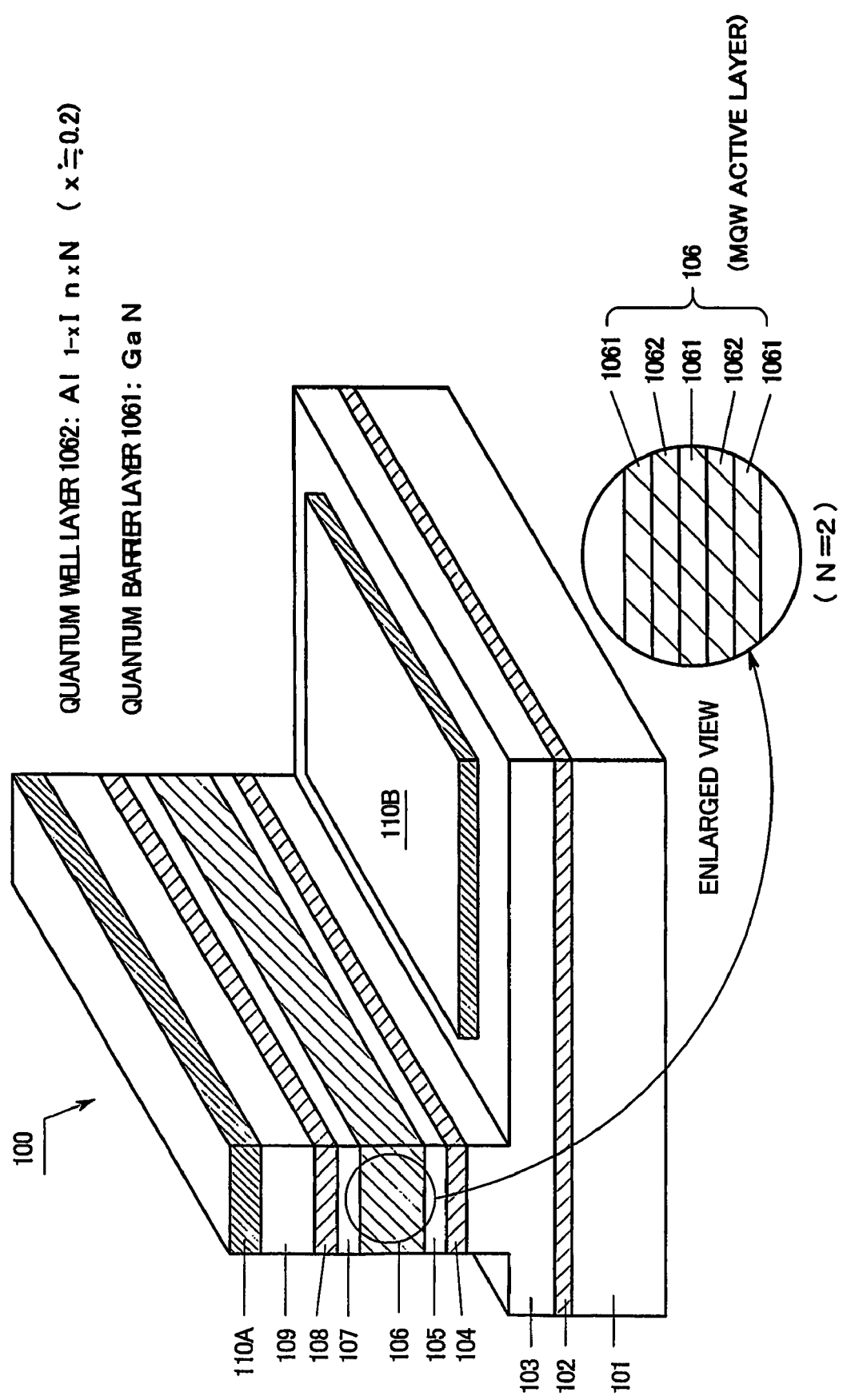
FIG. 6 is a perspective view showing an edge emitting type of conventional semiconductor laser.

FIGS. 3A and 3B are graphs showing output characteristics of the edge emitting type of semiconductor laser comprising layers described above. The edge emitting type of semiconductor laser has conventional structure as disclosed in the patent document 2 (FIG. 6) except for the above explained semiconductor crystal layer structure 10 (FIG. 1). In short, the semiconductor laser is formed to have conventional structure such as a size and shape of a laser cavity, materials and arrangement of an electrode, and other details as much as possible.

In these graphs, luminous intensity becomes smaller as amount of injection carrier I decreases. Considering carrier amount I in a range about $0.1 I_0$ to $0.2 I_0$ to the standard value $I_0$ as a boundary, when the amount of injecting carrier I is larger than the boundary, it is understood that the relationship between amount of injecting carrier I and the luminous intensity is nonlinear.

In FIG. 3A, when the amount of injection carrier I is over $0.2 I_0$, the luminous intensity is proportional to the square or the cube of the amount of injection carrier I. When $I=I_0$, it is understood that narrowing spectrum to a line is obviously realized. That may be because stimulated emission is occurred in the active layer 12. The luminous intensity is measured to increase until the carrier concentration becomes about $10^{19} cm^{-3}$. Then the gradient of the luminous intensity increase becomes a little small because the gain is saturated.

In FIG. 2, by arranging to be $b_{MAX} \approx b_{MIN}$ and the indium composition ratio a (i.e., average value) in the active layer 12 is as same as described above, another semiconductor laser is formed as an object for comparison. Comparing output characteristic of a conventional edge emitting type of semiconductor laser comprising the active layer with that of the edge emitting type of semiconductor laser in the first embodiment, the semiconductor laser in the first embodiment can oscillate laser at about 70% of the threshold carrier concentration of the conventional semiconductor laser.

According to the above experiments, the following consequences can be drawn.

(1) Period L of indium composition ratio a in the z axis direction is preferably corresponding to around Bohr radius R (one time to four times).

(2) By applying such structure, only one crystal growth process of the active layer 12 having single layer structure enables to form an active layer having a larger gain by controlling supply amount of TMI gas per unit time as illustrated in FIG. 2.

(3) As a result, productivity of a light-emitting semiconductor device can be remarkably improved.

Embodiment 2

Figure 4:
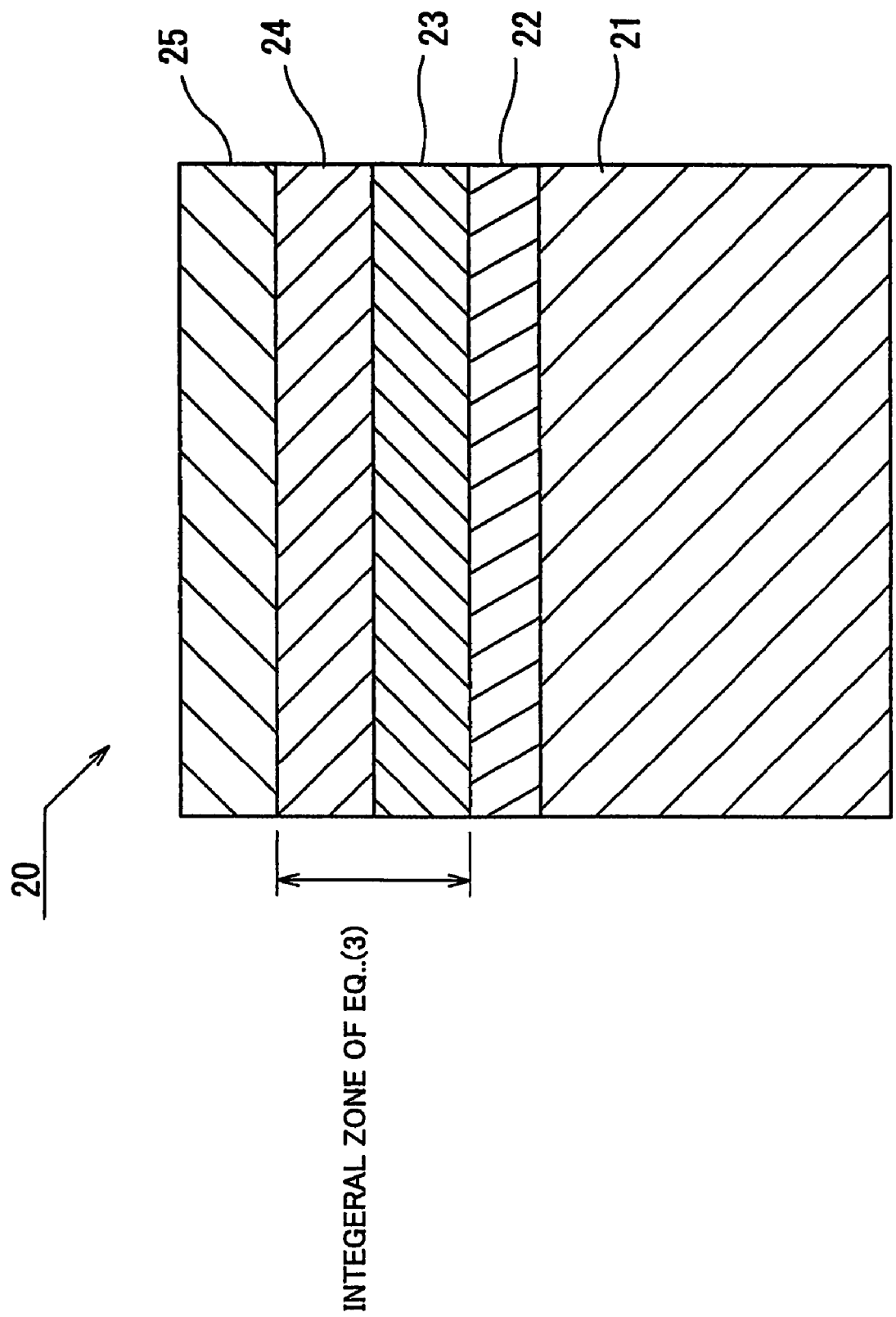
FIG. 4 is a sectional view illustrating layer structure of semiconductor crystal in a surface emitting type of semiconductor laser in the present invention which comprises an active layer.

FIG. 4 is a sectional view showing semiconductor crystal layer structure 20 of a surface emitting type of semiconductor laser comprising the active layer of the present invention. Sign 21 represents an n-type contact layer made of n-type GaN and sign 24 represents a p-type layer made of p-type AlGaN.

The surface emitting type of semiconductor laser comprises an n-type DBR layer 22 made of n-type InGaN and a DBR layer 25 made of dielectric, each of which is formed on the upper side and the bottom side of an active layer 23 made of InGaN (In composition ratio a=0.02), and each of the DBR layers form a reflection plane vertical to the z axis. In short, by forming reflection planes which are vertical to the z axis at both of the upper side and the bottom side of the active layer 23, a laser cavity is obtained.

Then, optical distance $\Delta Z$ ($\equiv \int n(z, \lambda) dz$) between two reflection planes are arranged to an integral multiple of half a oscillation wavelength $\lambda/2$. The integer number may preferably in a range from 1 to 10. Here the "optical distance $\Delta Z$" is a length in the z axis direction in optical cavity region defined by the above described equation (3).

The active layer 23 is formed as same as the active layer 12 of the first embodiment. That is, the composition ratio a of indium (In) of the active layer 23 is varied at a constant period L in waveform in a direction parallel to the growth axis of the active layer 23. Each structure of other component may be the same as that of a well-known and common semiconductor laser of a surface emitting type. For example, by applying the above described structure, a semiconductor laser can be manufactured more easily than a conventional surface emitting type of semiconductor laser.

Preferably, layers having large energy gap such as a clad layer are formed on and below the active layer 23. Because that enables to confine carriers and lights, a surface emitting type of semiconductor laser which has high emission efficiency and high output power can be obtained.

Embodiment 3

Figure 5:
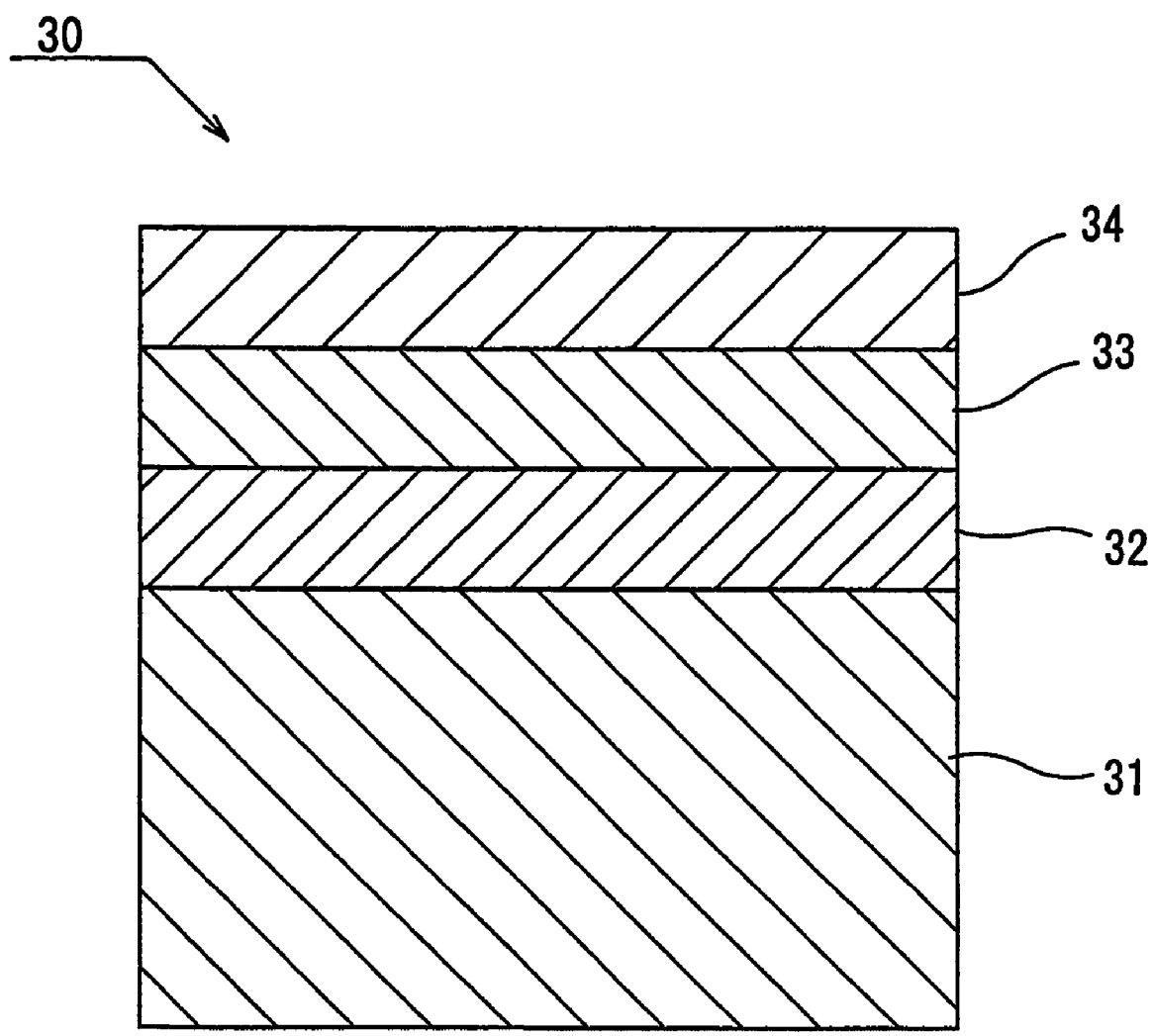
FIG. 5 is a sectional view illustrating layer structure (a modified example of FIG. 1) of semiconductor crystal comprising an active layer in the present invention.

FIG. 5 is a sectional view illustrating a deposition layer structure 30 of crystal semiconductor mainly comprising the AlInGaN active layer 32. The structure (deposition layer structure 30) is a modified example of the structure shown in FIG. 1. In short, this structure can be applied to an edge emitting type of semiconductor laser and so on. In the present embodiment, indium composition ratio a is maintained as same as that in the first embodiment (FIG. 1), and add aluminum (Al) to decrease composition ratio of gallium (Ga) in the active layer 32 in order to shorten oscillation wavelength $\lambda$.

Signs 31, 33, and 34 represent an n-type contact layer made of gallium nitride (GaN), a p-type clad layer made of Mg-doped AlGaN, and a p-type contact layer made of Mg-doped AlGaN, respectively.

Indium composition ratio a is maintained high as in the first embodiment in order to promote localization of excitons. For example, it can be also understood from the patent document 2 that excitons are promoted to be localized by keeping indium composition ratio a high.

According to that structure, a semiconductor laser and a light-emitting diode (LED) which emit light having shorter wavelength such as near ultraviolet can be also obtained by mixing appropriate amount of aluminum to the active layer. When a luminescent material is used in a light-emitting semiconductor device, a light-emitting device which emits light of shorter output wavelength is advantageous because it can promote excitation in the luminescent material. Accordingly, such structure also has larger utility value.

In the above first, second and third embodiments, the active layer 12, the active layer 23 and the active layer 32 are not doped with impurities intentionally. In all these embodiments, silicon is doped into each of the active layer 12, the active layer 23 and the active layer 32 and its electron concentration is arranged to be $5.0 \times 10^{16}/\text{cm}^3$ to $1 \times 10^{18}/\text{cm}^3$ to obtain a light-emitting semiconductor device.

In such a device, not only exciton-exciton scattering but also electron-exciton scattering effectively contributes to stimulated emission. That is, the stimulated emission mechanism is dependent on the electron concentration in the active layer. The inventors of the present invention confirmed that the stimulated emission process due to electron-exciton scattering is also generated overlapping with the stimulated emission due to exciton-exciton scattering process when the active layer has the electron concentration described above. As a result, when the active layer has those ranges of electron concentration, its oscillation threshold can be decreased by about 10% compared with that of the laser with a non-doped active layer.

INDUSTRIAL APPLICABILITY

The present invention is useful not only to a a surface emitting type of semiconductor laser and an edge emitting type, but also to a LED and other kinds of light-emitting semiconductor devices.

And the present invention is useful not only to a light-emitting semiconductor device but also to a light-receiving semiconductor device. The present application is based on a Japanese patent application No. 2003-297682 filed on Aug. 21, 2003 and includes all of its contents.

The invention claimed is:

1. A light-emitting semiconductor device which is formed by laminating plural layers of group III nitride compound semiconductor, comprising:
    an active layer having single layer structure of a semiconductor layer at least including indium (In), wherein:
        a composition ratio a of In is the ratio of atoms to whole number of atoms of type III or the molar fraction to atoms of the type III atoms,
        the composition ratio of In has a smooth variation In concentration, and
        the composition ratio a of indium (In) is in a range of 0.0001 to 0.05, said composition ratio a is varied at a constant period L in waveform in a direction of the z axis which is parallel to the growth axis of said active layer, and said period L is arranged to be an approximately constant value selected from a range of 1 nm to 10 nm.

2. A light-emitting semiconductor device which is formed by depositing plural layers of group III nitride compound semiconductor, comprising:
    an active layer having single layer structure of a semiconductor layer at least including indium (In), wherein:
        a composition ratio a of In is the ratio of atoms to whole number of atoms of type III or the molar fraction to atoms of the type III atoms,
        the composition ratio of In has a smooth variation In concentration, and
        the composition ratio a of indium (In) is in a range of 0.0001 to 0.05, said composition ratio a is varied at a constant period L in waveform in a direction of the z axis which is parallel to the growth axis of the active layer, and said period L is arranged to be an approximately constant value selected from a range of one to six times of Bohr radius R.

3. A light-emitting semiconductor device according to claim 1, wherein said period L is in an approximately constant value selected from a range of 2.4 nm to 6.8 nm.

4. A light-emitting semiconductor device according to claim 1, wherein said composition ratio a is in a range from 0.010 to 0.040.

5. A light-emitting semiconductor device according to claim 1, wherein gradient δa/δz is arranged to be 0.01 nm$^{-1}$ or less at each place.

6. A light-emitting semiconductor device according to claim 1, comprising:
   a pair of reflection planes vertical to the z axis, each of which is formed on or above, and on or below said active layer, respectively,
   wherein said light-emitting semiconductor device comprises a surface emitting type of semiconductor laser and optical distance ΔZ between said two reflection planes are arranged to an integral multiple of half an oscillation wavelength λ (λ/2) of laser emitted from said active layer.

7. A light-emitting semiconductor device according to claim 6, wherein said integral multiple is in a range of from 1 to 10.

8. A method for manufacturing a light-emitting semiconductor device of claim 1, wherein supply amount of indium (In) material gas per unit time to the crystal growth surface on which said active layer grows is varied at a constant period selected from a range of 10 sec. to 6 min.

9. A method for manufacturing a light-emitting semiconductor device of claim 1, wherein said period is in an approximately constant selected from a range of 30 sec. to 2 min.

10. A light-emitting semiconductor device according to claim 1, wherein said active layer is doped with donor impurity so that electric concentration may be in a range of $1 \times 10^{16}/cm^3$ to $1 \times 10^{18}/cm^3$ at a room temperature.

11. A light-emitting semiconductor device according to claim 2, wherein said period L is in an approximately constant value selected from a range from 2.4 nm to 6.8 nm.

12. A light-emitting semiconductor device according to claim 2, wherein said composition ratio a is in a range from 0.010 to 0.040.

13. A light-emitting semiconductor device according to claim 3, wherein said composition ratio a is in a range from 0.010 to 0.040.

14. A light-emitting semiconductor device according to claim 2, wherein gradient δa/δz is arranged to be 0.01 nm$^{-1}$ or less at each place.

15. A light-emitting semiconductor device according to claim 2, comprising:
   a pair of reflection planes vertical to the z axis, each of which is formed on or above and on or below said active layer, respectively,
   wherein said light-emitting semiconductor device comprises a surface emitting type of semiconductor laser and optical distance ΔZ between said two reflection planes are arranged to an integral multiple of half an oscillation wavelength λ (λ/2) of laser emitted from said active layer.

16. A method for manufacturing a light-emitting semiconductor device of claim 2, wherein supply amount of indium (In) material gas per unit time to the crystal growth surface on which said active layer grows is varied at a constant period selected from a range of 10 sec. to 6 min.

17. A method for manufacturing a light-emitting semiconductor device of claim 3, wherein supply amount of indium (In) material gas per unit time to the crystal growth surface on which said active layer grows is varied at a constant period selected from a range of 10 sec. to 6 min.

18. A method for manufacturing a light-emitting semiconductor device of claim 2, wherein said period is in an approximately constant selected from a range of 30 sec. to 2 min.

19. A method for manufacturing a light-emitting semiconductor device of claim 3, wherein said period is in an approximately constant selected from a range of 30 sec. to 2 min.

20. A light-emitting semiconductor device according to claim 2, wherein said active layer is doped with donor impurity so that electric concentration may be in a range of $1 \times 10^{16}/cm^3$ to $1 \times 10^{18}/cm^3$ at a room temperature.

21. A light-emitting semiconductor device according to claim 1, wherein said wave form is substantially a sine wave.

22. A light-emitting semiconductor device according to claim 2, wherein said wave form is substantially a sine wave.

* * * * *